United States Patent
Zhu et al.

(10) Patent No.: US 8,952,836 B2
(45) Date of Patent: Feb. 10, 2015

(54) PIPELINE ANALOG-TO-DIGITAL CONVERTER

(71) Applicant: Shanghai Huahong Grace Semiconductor Manufacturing Corporation, Shanghai (CN)

(72) Inventors: Hongwei Zhu, Shanghai (CN); Yuwei Zhao, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/254,462

(22) Filed: Apr. 16, 2014

(65) Prior Publication Data
US 2014/0320323 A1 Oct. 30, 2014

(30) Foreign Application Priority Data
Apr. 26, 2013 (CN) .......................... 2013 1 0150365

(51) Int. Cl.
*H03M 1/00* (2006.01)
*H03M 1/14* (2006.01)
*H03M 1/08* (2006.01)

(52) U.S. Cl.
CPC .............. *H03M 1/145* (2013.01); *H03M 1/002* (2013.01); *H03M 1/08* (2013.01)
USPC ........... 341/122; 341/118; 341/155; 341/158; 341/159; 375/260; 375/316; 375/340; 327/144; 327/157; 327/148; 327/163; 327/285

(58) Field of Classification Search
CPC ......... H03M 1/00; H03M 1/002; H03M 1/12; H03M 1/361; H03M 1/1215; H03M 1/0818; H04N 5/355; H04N 5/3577; H04N 3/155; H03L 7/00; H03L 7/06; H03L 7/18; H02M 3/07; H04L 27/00; H03K 5/00; H03K 5/15
USPC .......... 341/118, 122, 155, 158, 159; 375/260, 375/316, 340; 327/163, 295, 148, 144, 157
See application file for complete search history.

(56) References Cited

U.S. PATENT DOCUMENTS

| 5,177,484 | A  | * | 1/1993  | Bruckmann      | 341/172 |
| 7,956,790 | B2 | * | 6/2011  | Chmelar et al. | 341/158 |
| 8,427,208 | B2 | * | 4/2013  | Ozeki          | 327/148 |
| 8,576,951 | B2 | * | 11/2013 | Mombers et al. | 375/316 |
| 8,593,317 | B2 | * | 11/2013 | Aras et al.    | 341/122 |
| 8,730,075 | B2 | * | 5/2014  | Aras et al.    | 341/122 |

* cited by examiner

*Primary Examiner* — Lam T Mai
(74) *Attorney, Agent, or Firm* — MKG, LLC (57) ABSTRACT

A pipeline analog-to-digital converter is disclosed which includes at least one periodic unit consisting of two adjacent stages that jointly use two capacitor networks of the same structure. Each of the capacitor networks includes two identical capacitors, two switches and four terminals. On/off states of the switches and interconnection configuration of the terminals are controlled by clock signals to switch the periodic unit between four possible connection configurations. During operation of the periodic unit, when the upstream stage is in a sampling phase that involves one of the capacitor networks as well as a reference capacitor, the downstream stage uses the other of the capacitor networks to conduct residue amplification; and on the other hand, when the upstream stage is using one of the capacitor networks for residue amplification, the downstream stage relies also on this capacitor network for sampling, leaving the other of the capacitor networks idle.

10 Claims, 8 Drawing Sheets

PIPELINE ANALOG-TO-DIGITAL CONVERTER

CROSS-REFERENCES TO RELATED APPLICATIONS

This application claims the priority of Chinese patent application number 201310150365.8, filed on Apr. 26, 2013, the entire contents of which are incorporated herein by reference.

TECHNICAL FIELD

This invention relates generally to semiconductor integrated circuits, and in particular, to a pipeline analog-to-digital converter (ADC).

BACKGROUND

Pipeline ADC's have been extensively used in electronic systems because they can offer both a high speed and a satisfying resolution. Increasing demand for performance improvement of such devices drive manufacturers to develop pipeline ADCs with higher speed, higher accuracy, lower power consumption and smaller die size and other improved properties. However, such effort is frustrated by some intrinsic limitations from the structural characteristics of conventional pipeline ADCs. For example, in order to ensure tolerable low levels of capacitor mismatch and KT/C noise, each stage of a conventional pipeline ADC requires at least two capacitors with a capacitance larger than a certain value, and thus adversely leads to increase in power consumption and die size.

Figure 1:
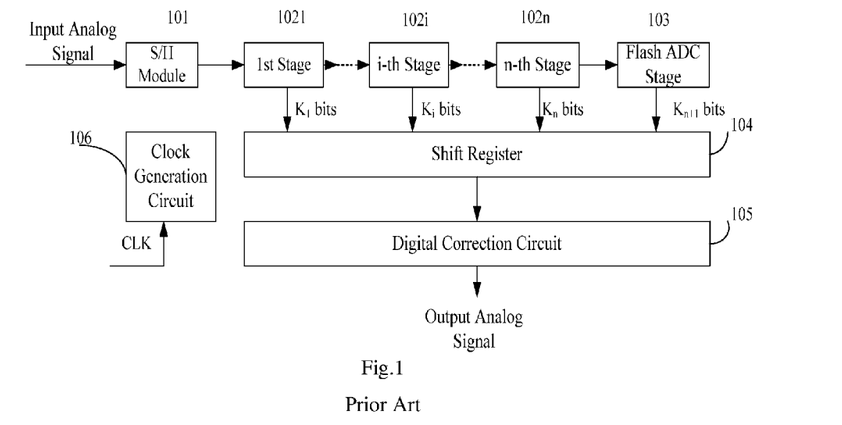
FIG. 1 illustrates the architecture of a conventional pipeline ADC.

FIG. 1 illustrates the architecture of a conventional pipeline ADC, in which an input analog signal is first obtained by a sample-and-hold (S/H) module 101 and subsequently propagates through a number of consecutive stages, for example, a first stage 1021, ..., an i-th stage 102i, ..., an n-th stage 102n and a last flash ADC stage 103, with each stage generating a corresponding number of digital bits, for example, $K_1$ bits, ..., $K_i$ bits, ..., $K_n$ bits and $K_{n+1}$ bits. These bits are then fed to a shift register 104 as a digital signal, which is subsequently processed and output by a digital correction circuit 105. This pipeline ADC further includes a clock generation circuit 106 for generating clock signals and thereby switching the stages between different operation modes. In the case that the pipeline ADC of FIG. 1 is a 10-bit resolution one, implemented with the last stage as a 2-bit stage that contains a 2-bit parallel ADC and each of the other stages as a 1.5-bit stage that contains a 1.5-bit multiplying ADC (MADC), the 2-bit ADC owns no redundancy bit, while each 1.5-bit MADC can produce four possible binary code outputs, '00', '01', '10' and '11', in which the former three are effective and the last is redundant.

Figure 2:
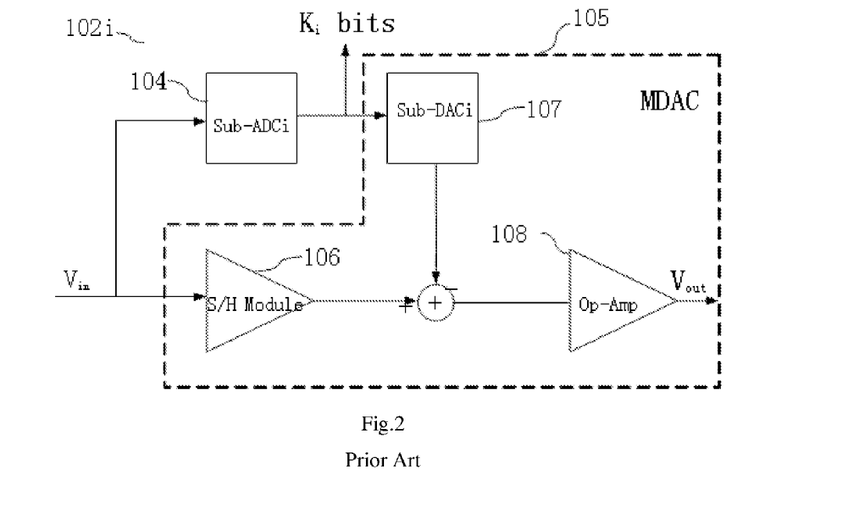
FIG. 2 is a schematic of one stage of the pipeline ADC of FIG. 1.

FIG. 2 is a schematic of a non-last stage of the pipeline ADC of FIG. 1. As illustrated, the i-th stage 102i includes an i-th sub-ADC 104 and a residue gain amplifier (i.e., a multiplying digital-to-analog converter (MDAC)) 105, and the MDAC 105 further includes a S/H 106, an i-th sub-DAC 107 and an operational amplifier (op-amp) 108. During operation, an input analog signal $V_{in}$ is first sampled and held steady on the S/H 106, while the sub-ADC 104 converts the input analog signal $V_{in}$ to a digital signal of $K_i$ bits. Then the sub-DAC 107 converts the digital signal of $K_i$ bits to a new analog signal, and the new analog signal is subtracted from the sampled input analog signal $V_{in}$ to result in a residue signal. The residue signal of the subtraction is then amplified by the op-amp 108 to result in an output analog signal $V_{out}$, and the output analog signal $V_{out}$ is fed to the next stage as an input analog signal thereof.

Figure 3A:
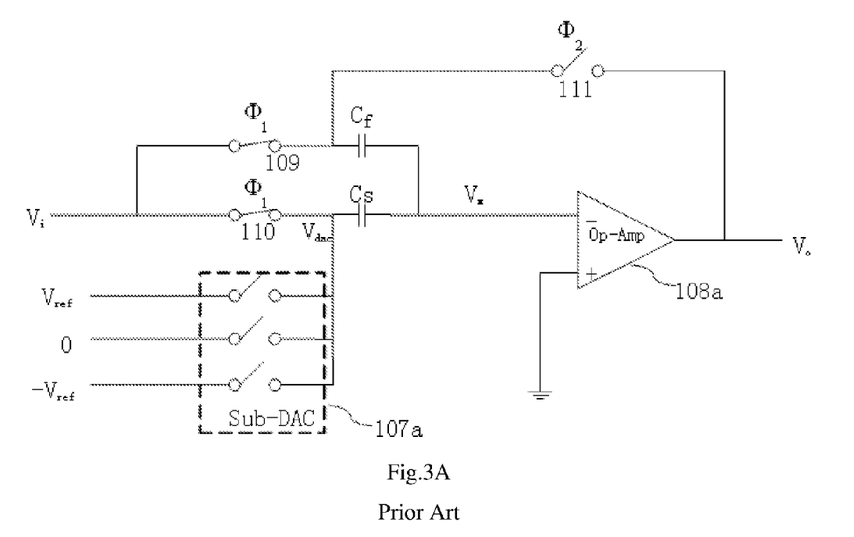
FIG. 3A is a schematic of the stage operating in a sampling phase when the MDAC of FIG. 2 is a 1.5-bit MDAC.

This process will be described in greater detail with reference to an example in which the MDAC 105 is exemplified as a 1.5-bit MDAC, for the sake of convenience in explanation. As shown in FIG. 3A, the stage of FIG. 2 includes two capacitors $C_f$ and $C_s$, a sub-DAC 107a and an op-amp 108a. The sub-DAC 107a is realized by three switch-controlled reference voltage levels, $V_{ref}$, 0 and $-V_{ref}$, and produces an output voltage $V_{dac}$. The stage further includes: switches 109 and 110, both controlled by a first clock signal $\Phi_1$; and another switch 110 that is controlled by a second clock signal $\Phi_2$. A timing diagram of the two clock signals are shown in FIG. 3C. In the sampling phase, the switches 109 and 110 are closed to allow the input $V_i$ to be stored on (i.e., sampled by) the capacitors $C_f$ and $C_s$, while the switch 111 is open, leaving the op-amp 108a idle. At this time, the quantity of electric charge at the input terminal of the op-amp 108a is:

$$Q_1 = -(C_s + C_f)V_i \qquad (1)$$

Figure 3B:
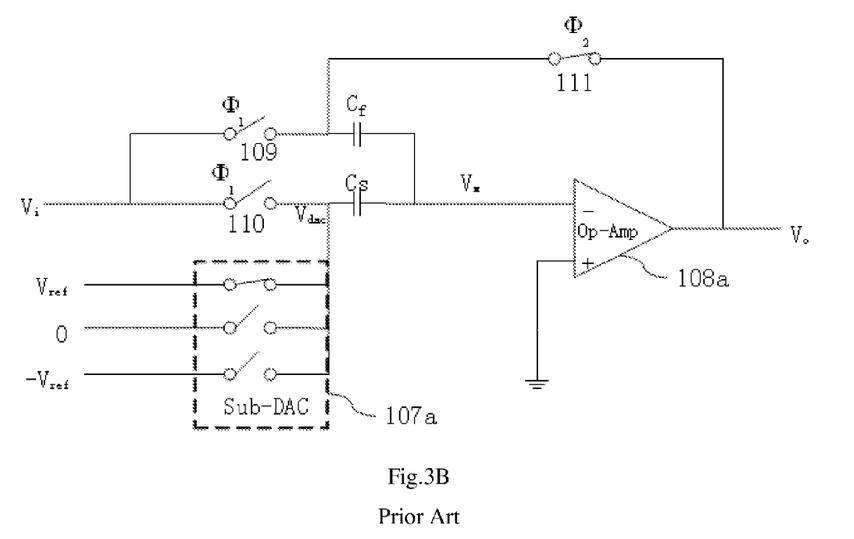
FIG. 3B is a schematic of the stage operating in a holding phase when the MDAC of FIG. 2 is a 1.5-bit MDAC.
Figure 3C:
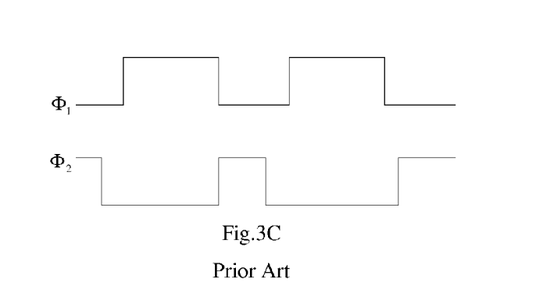
FIG. 3C shows a timing diagram for the stage of FIGS. 3A and 3B.

On the other hand, when the 1.5-bit MDAC is in a holding phase, or referred to as "a residue amplification phase", as shown in FIG. 3B, in which the associated stage gives an amplified residue as an output analog signal, the switches 109 and 110 are open, while the switch 111 is closed, electrically connecting the upper plate of the capacitor $C_f$ to the output terminal of the op-amp 108a to activate the op-amp 108a. As a result, the output voltage $V_{dac}$ of the sub-DAC 107a is applied on the upper plate of the capacitor $C_s$, and the quantity of electric charge at the input terminal of the op-amp 108a can be expressed as:

$$Q_2 = (V_x - V_{dac})C_s + (V_x - V_o)C_f \qquad (2)$$

where $V_o = A \times (0 - V_x)$, A represents the finite DC gain of the op-amp 108a, and $V_x$ is the voltage at the input terminal of the op-amp 108a (i.e., the negative input terminal, since the positive input terminal is grounded, as illustrated).

According to the principle of charge conversation, from the equation $Q_1 = Q_2$, the following formula can be obtained:

$$V_o = V_i \frac{A}{\beta A + 1} - V_{dac} \frac{C_s}{C_s + C_f} \frac{A}{\beta A + 1} \qquad (3)$$

where, $\beta$ is a feedback factor with the value of $C_f/(C_f + C_s)$.

First-order approximating $A/(\beta A + 1)$ to $1/\beta \times (1 - 1/\beta A)$ according to $A/(\beta A + 1) \approx 1/\beta \times (1 - 1/\beta A)$ can modify formula (3) to:

$$V_o = V_i \frac{C_s + C_f}{C_f} \left(1 - \frac{1}{\beta A}\right) - V_{dac} \frac{C_s}{C_f} \left(1 - \frac{1}{\beta A}\right) \qquad (4)$$

When assuming the amplification magnitude A of the op-amp 108a is an infinitely great number, formula (4) is further simplified to:

$$V_o = V_i \frac{C_s + C_f}{C_f} - V_{dac} \frac{C_s}{C_f} \qquad (5)$$

During the operation of the conventional pipeline ADC comprised of a plurality of such stages that are interconnected together, when a certain stage is in the holding phase as shown in FIG. 3B, the adjacent, subsequent stage will operate in the sampling phase as shown in FIG. 3A. Accordingly, an output analog signal $V_O$ of the op-amp 108a of the upstream stage will be taken as an input signal $V_i$ for the downstream stage and is sampled by the capacitors $C_f$ and $C_s$ thereof. As a result, as implied in formula (5), the capacitors $C_f$ and $C_s$ of each stage of the conventional pipeline ADC must assume a capacitance that is larger than a certain value. This may lead to increase in the power consumption and die size.

SUMMARY

The present invention is directed to a pipeline ADC which enables capacitor sharing between adjacent stages and is thereby capable of reducing total capacitor area, power consumption and die size.

In one aspect, the present invention provides a pipeline ADC, including: a plurality of stages, wherein a first stage of the plurality of stages is adapted to receive an external analog signal and each of the plurality of stages is adapted to output an analog signal serving as an input analog signal for a next stage, wherein each odd-number-th stage and an adjacent next even-number-th stage thereof form a periodic unit; a first capacitor network and a second capacitor network for each periodic unit, the first and second capacitor networks both coupled to a corresponding periodic unit and having an identical structure; a first clock signal and a second clock signal inverted in phase and both coupled to each periodic unit, wherein the first and second clock signals are adapted to control one of the odd-number-th and even-number-th stages of each periodic unit to operate in a sampling phase, and to control the other of the odd-number-th and even-number-th stages of each periodic unit to operate in a holding phase; and a third clock signal and a fourth clock signal inverted in phase and both coupled to each periodic unit, wherein the third and fourth clock signals are adapted to couple each first capacitor network to one of the odd-number-th and even-number-th stages of a corresponding periodic unit, and to couple each second capacitor network to the other of the odd-number-th and even-number-th stages of the corresponding periodic unit.

In a preferred embodiment, the odd-number-th stage of each periodic unit includes a first ADC, a first digital-to-analog converter (DAC), a reference capacitor and a first operational amplifier (op-amp), and the even-number-th stage of each periodic unit comprises a second ADC, a second DAC and a second op-amp.

In a preferred embodiment, the first capacitor network of each periodic unit includes: a first capacitor, having a first terminal defined as a T1 terminal and a second terminal defined as a FB1 terminal; a first switch, having a first terminal coupled to the second terminal of the first capacitor and a second terminal defined as a B1 terminal; a second capacitor, having a first terminal coupled to the first terminal of the first capacitor and a second terminal defined as a DAC1 terminal; and a second switch, having a first terminal coupled to the second terminal of the second capacitor and a second terminal coupled to the second terminal of the first capacitor, wherein the second capacitor network of each periodic unit includes: a third capacitor, having a first terminal defined as a T2 terminal and a second terminal defined as a FB2 terminal; a third switch, having a first terminal coupled to the second terminal of the third capacitor and a second terminal defined as a B2 terminal; a fourth capacitor, having a first terminal coupled to the first terminal of the third capacitor and a second terminal defined as a DAC2 terminal; and a fourth switch, having a first terminal coupled to the second terminal of the fourth capacitor and a second terminal coupled to the second terminal of the third capacitor, and wherein one of the third and fourth clock signals is coupled to both of the first and second switches of the first capacitor network of each periodic unit, and the other of the third and fourth clock signals is coupled to both of the third and fourth switches of the second capacitor network of each periodic unit.

In a preferred embodiment, the first, second, third and fourth capacitors of each periodic unit each have a capacitance that is half of a capacitance of the reference capacitor.

In a preferred embodiment, each of the third and fourth clock signals has a cycle length that is twice a cycle length of each of the first and second clock signals.

In a preferred embodiment, when both of the first and third clock signals are at a high potential level and both of the second and fourth clock signals are at a low potential level, the odd-number-th stage of each periodic unit operates in the sampling phase, while the even-number-th stage of each periodic unit is in the holding phase, concurrently with, in each periodic unit, an analog input of the odd-number-th stage being coupled to both of the B1 terminal of the corresponding first capacitor network and a first terminal of the reference capacitor, both of the first and second switches of the corresponding first capacitor network being closed, the T1 terminal of the corresponding first capacitor network and a second terminal of the reference capacitor being interconnected and both grounded, an input terminal of the first ADC being coupled to the analog input of the odd-number-th stage, an output terminal of the first ADC being coupled to an input terminal of the first DAC, an output terminal of the first DAC being disconnected from the second terminal of the reference capacitor, both of the FB1 and DAC1 terminals of the corresponding first capacitor network being kept idle, the T2 terminal of the corresponding second capacitor network being coupled to a negative input terminal of the second op-amp, an output terminal of the first op-amp being coupled to the B2 terminal of the corresponding second capacitor network, both of the third and fourth switches of the corresponding second capacitor network being open to disconnect the output terminal of the first op-amp from the third and fourth capacitors of the corresponding second capacitor network, the DAC2 terminal of the corresponding second capacitor network being coupled to an output terminal of the second DAC, and the FB2 terminal of the corresponding second capacitor network being coupled to the output terminal of the second op-amp.

In a preferred embodiment, when both of the first and fourth clock signals are at a low potential level and both of the second and third clock signals are at a high potential level, the odd-number-th stage of each periodic unit operates in the holding phase, while the even-number-th stage of each periodic unit is in the sampling phase, concurrently with, in each periodic unit, the output terminal of the first DAC being coupled to the second terminal of the reference capacitor, the T1 terminal of the corresponding first capacitor network and the second terminal of the reference capacitor being interconnected and both coupled to a negative input terminal of the first op-amp, both of the FB1 and DAC1 terminals of the corresponding first capacitor network being kept idle, the B1 terminal of the corresponding first capacitor network being coupled to the output terminal of the first op-amp, the output terminal of the first op-amp being coupled to an input terminal of the second ADC, the T2 terminal of the corresponding second capacitor network being coupled to the negative input terminal of the second op-amp, the output terminal of the first op-amp being coupled to the B2 terminal of the corresponding second capacitor network, both of the third and fourth switches of the corresponding second capacitor network being open to disconnect the output terminal of the first op-amp from the third and fourth capacitors of the corresponding second capacitor network, both of the DAC2 and FB2 terminals of the corresponding second capacitor network being kept idle, and an output terminal of the second ADC being coupled to an input terminal of the second DAC.

In a preferred embodiment, when both of the first and fourth clock signals are at a high potential level and both of the second and third clock signals are at a low potential level, the odd-number-th stage of each periodic unit operates in the sampling phase, while the even-number-th stage of each periodic unit is in the holding phase, concurrently with, in each periodic unit, the analog input of the odd-number-th stage being coupled to both of the B2 terminal of the corresponding second capacitor network and the first terminal of the reference capacitor, both of the third and fourth switches of the corresponding second capacitor network being closed, the T2 terminal of the corresponding second capacitor network and the second terminal of the reference capacitor being interconnected and both grounded, the input terminal of the first ADC being coupled to the analog input of the odd-number-th stage, the output terminal of the first ADC being coupled to the input terminal of the first DAC, the output terminal of the first DAC being disconnected from the second terminal of the reference capacitor, both of the FB2 and DAC2 terminals of the corresponding second capacitor network being kept idle, the T1 terminal of the corresponding first capacitor network being coupled to the negative input terminal of the second op-amp, the output terminal of the first op-amp being coupled to the B1 terminal of the corresponding first capacitor network, both of the first and second switches of the corresponding first capacitor network being open to disconnect the output terminal of the first op-amp from the first and second capacitors of the corresponding first capacitor network, the DAC1 terminal of the corresponding first capacitor network being coupled to the output terminal of the second DAC, and the FB1 terminal of the corresponding first capacitor network being coupled to the output terminal of the second op-amp.

In a preferred embodiment, when both of the first and third clock signals are at a low potential level and both of the second and fourth clock signals are at a high potential level, the odd-number-th stage of each periodic unit operates in the holding phase, while the even-number-th stage of each periodic unit is in the sampling phase, concurrently with, in each periodic unit, the output terminal of the first DAC being coupled to the second terminal of the reference capacitor, the T2 terminal of the corresponding second capacitor network and the second terminal of the reference capacitor being interconnected and both coupled to the negative input terminal of the first op-amp, both of the FB2 and DAC2 terminals of the corresponding second capacitor network being kept idle, the B2 terminal of the corresponding second capacitor network being coupled to the output terminal of the first op-amp, the output terminal of the first op-amp being coupled to the input terminal of the second ADC, the T1 terminal of the corresponding first capacitor network being coupled to the negative input terminal of the second op-amp, the output terminal of the first op-amp being coupled to the B1 terminal of the corresponding first capacitor network, both of the first and second switches of the corresponding first capacitor network being open to disconnect the output terminal of the first op-amp from the first and second capacitors of the corresponding first capacitor network, both of the DAC1 and FB1 terminals of the corresponding first capacitor network being kept idle, and the output terminal of the second ADC being coupled to the input terminal of the second DAC.

In a preferred embodiment, the pipeline ADC includes eight stages that form four periodic units.

Arrangement of each two adjacent stages into a periodic unit and the use of two inter-switchable capacitor networks jointly enable the pipeline ADC of the invention to operate in such a manner that, in the holding phase of the upstream stage of each periodic unit, the capacitor network coupled to the upstream stage is capable of both residue amplification for the upstream stage and signal sampling for the downstream stage. As such, the capacitor network is shared between the two adjacent stages to eliminate the need for additional sampling capacitor(s) and associated process(es) for the downstream stage, thereby contributing to total capacitor area, power consumption and die size reduction of the pipeline ADC.

BRIEF DESCRIPTION OF THE DRAWINGS

The invention will be described in greater detail with reference to the following exemplary embodiments, taken in conjunction with the accompanying drawings, in which.

DETAILED DESCRIPTION

Figure 4A:
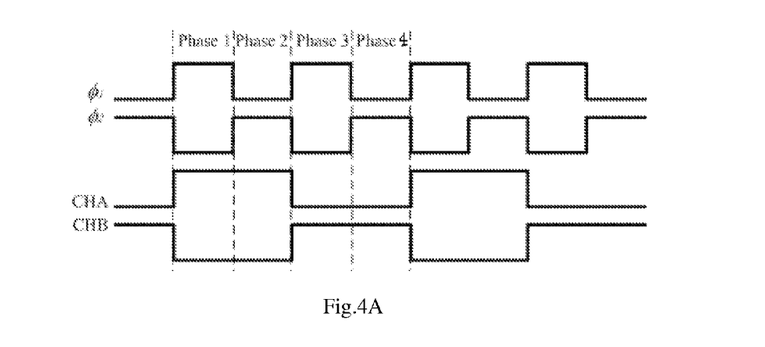
FIG. 4A shows a timing diagram for a periodic unit of a pipeline ADC in accordance with embodiments of the present invention.

FIG. 4A illustrates a timing diagram for a periodic unit of a pipeline ADC in accordance with embodiments of the present invention, while FIGS. 4B to 4E are schematics of the periodic unit in four different connection configurations. As illustrated, the pipeline ADC is comprised of a plurality of stages, each having an analog input terminal, a digital output terminal and an analog output terminal.

In the pipeline ADC, the analog input terminal of a first stage is connected to an external analog signal, while the analog input terminals of the other stages are connected to the analog output terminals of the respective adjacent former stages.

Each stage of the pipeline ADC includes a sub-ADC and a residue gain amplifier. The sub-ADC is adapted to convert an input analog signal to an output digital signal, and the residue gain amplifier includes a sub-DAC adapted to convert the output digital signal to an interim analog signal which is subsequently subtracted from the input analog signal. The residue is then amplified by an operational amplifier (op-amp) and output as an output analog signal of the associated stage.

The residue gain amplifier operates in a cyclic manner and each associated cycle consists of a sampling phase and a holding phase. In each cycle, the residue gain amplifier switches between the two phases under the control of a first clock signal $\Phi_1$ and a second clock signal $\Phi_2$ that are inverted in phase. In addition, residue gain amplifiers of all odd-number-th stages are synchronous in terms of the operation phase, but operate in different phase from all of the even-number-th stages.

Each two adjacent stages form a periodic unit and the pipeline ADC of the invention includes at least one such periodic unit. As illustrated, in each periodic unit, the upstream stage includes an upstream sub-ADC (not shown), an upstream sub-DAC (not shown), a reference capacitor $C_k$ and an upstream op-amp $1a$, and the downstream stage includes a downstream sub-ADC (not shown), a downstream sub-DAC (not shown) and a downstream op-amp $1b$.

Each periodic unit is coupled to a first capacitor network $C_A$ and a second capacitor network $C_B$ that are jointly used by, i.e., shared between, the upstream and downstream stages thereof.

The first capacitor network $C_A$ includes a first capacitor $C_1$ and a second capacitor $C_2$ that has the same capacitance as the first capacitor $C_1$, and the capacitance of the first and second capacitors $C_1$, $C_2$ is half of a capacitance of the reference capacitor $C_k$. The first capacitor $C_1$ has a first terminal that connects to a first terminal of the second capacitor $C_2$ and a second terminal that connects to a first terminal of a first switch $K_1$. The second capacitor $C_2$ further includes a second terminal that connects to a first terminal of a second switch $K_2$, and the first switch $K_1$ further has a second terminal that connects to a second terminal of the second switch $K_2$. Herein, the first terminal of the first capacitor $C_1$ is defined as a "T terminal", the second terminal of the first capacitor $C_1$ an "FB terminal", the second terminal of the second capacitor $C_2$ a "DAC terminal", and the second terminal of the first switch $K_1$ a "B terminal".

The second capacitor network $C_B$ assumes the same structure as the first capacitor network $C_A$. Additionally, The first and second switches $K_1$, $K_2$ of the first capacitor network $C_A$ are both coupled to a third clock signal CHA and switch between ON and OFF positions under the control thereof. Similarly, the first and second switches $K_1$, $K_2$ of the second capacitor network $C_B$ are both coupled to a fourth clock signal CHB and switch on and off under its control. The third and fourth clock signals CHA, CHB are inverted in phase and have an identical cycle length. The first and second clock signals $\Phi_1$, $\Phi_2$ also have an identical cycle length that is half of the cycle length of the third and fourth clock signals CHA, CHB.

Under the control of these four clock signals $\Phi_1$, $\Phi_2$, CHA, CHB, sharing of the first and second capacitor networks $C_A$, $C_B$ between the upstream and downstream stages of each periodic unit of the pipeline ADC is realized in four possible connection configurations that correspond to different regions of the timing diagram of FIG. 4A and are descried in detail below.

Figure 4B:
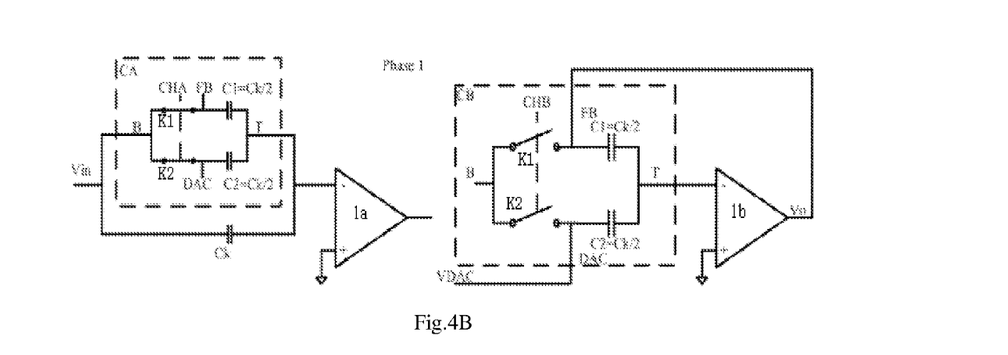
FIG. 4B is a schematic depicting a first connection configuration of the periodic unit of FIG. 4A.

Turning now to FIG. 4B, which depicts a first connection configuration of the periodic unit that corresponds to the Phase 1 region of the timing diagram of FIG. 4A, wherein both of the first and third clock signals $\Phi_1$, CHA have a high potential level, while the second and fourth clock signals $\Phi_2$, CHB each has a low potential level, so as to allow the upstream stage of the periodic unit to operate in the sampling phase. Accompanying this, the input analog signal $V_{in}$ is coupled to the B terminal of the first capacitor network $C_A$ as well as the first terminal of the reference capacitor $C_k$; the first and second switches $K_1$, $K_2$ of the first capacitor network $C_A$ are closed; the T terminal of the first capacitor network $C_A$ and the second terminal of the reference capacitor $C_k$ are interconnected and further directly connected to a negative input terminal of the upstream op-amp $1a$; an input terminal of the upstream sub-ADC is coupled to the input analog signal $V_{in}$ of the upstream stage of the periodic unit; an output terminal of the upstream sub-ADC is connected to an input terminal of the upstream sub-DAC; an output terminal of the upstream sub-DAC is disconnected from a second terminal of the reference capacitor $C_k$; and the FB and DAC terminals of the first capacitor network $C_A$ are both left disconnected, i.e., in an idle state. As such, the first and second capacitors $C_1$, $C_2$ of the first capacitor network $C_A$ are in parallel and the sum of their capacitances equals to the capacitance of the reference capacitor $C_k$. Further, these two parallel capacitors are also in parallel to the reference capacitor $C_k$, thereby enabling the sampling of the input analog signal $V_{in}$.

On the other hand, in this connection configuration, the downstream stage of the periodic unit is concurrently in its holding phase for analog residue amplification. In doing this, the T terminal of the second capacitor network $C_B$ is connected to a negative input terminal of the downstream op-amp $1b$; an output terminal of the upstream op-amp $1a$ is connected to the B terminal of the second capacitor network $C_B$; both of the first and second switches $K_1$, $K_2$ of the second capacitor network $C_B$ are open to disconnect the output terminal of the upstream op-amp $1a$ from the first and second capacitors $C_1$, $C_2$ of the second capacitor network $C_B$, thereby leaving the B terminal of the second capacitor network $C_B$ in an idle state; the DAC terminal of the second capacitor network $C_B$ is connected to an output terminal $V_{DAC}$ of the downstream sub-DAC; the FB terminal of the second capacitor network $C_B$ is connected to an output terminal of the downstream op-amp $1b$; and the output analog signal $V_o$ of the downstream op-amp $1b$ is fed to the next stage of the downstream stage of the periodic unit as an input analog signal. As such, the first and second capacitors $C_1$, $C_2$ of the second capacitor network $C_B$ connect in series between the output terminal $V_{DAC}$ of the downstream sub-DAC and the output terminal of the downstream op-amp $1b$. In such configuration, the first capacitor $C_1$ acts as a feedback capacitor, while the second capacitor $C_2$ as a sampling capacitor. In the case of a 1.5-bit-per-stage pipeline ADC, according to the above-described formula (5), $$V_o = V_i \frac{C_s + C_f}{C_f} - V_{dac} \frac{C_s}{C_f}$$

the analog output $V_o$ depends only on the ratio $C_s/C_f$. Provided that the capacitors $C_1$ and $C_2$ correspond to $C_f$ and $C_s$, respectively, and that they have an identical capacitance, it can be concluded that, with the aid of the second capacitor network $C_B$, the downstream stage acts as a multiply-by-two circuit and can produce correct voltage output.

Figure 4C:
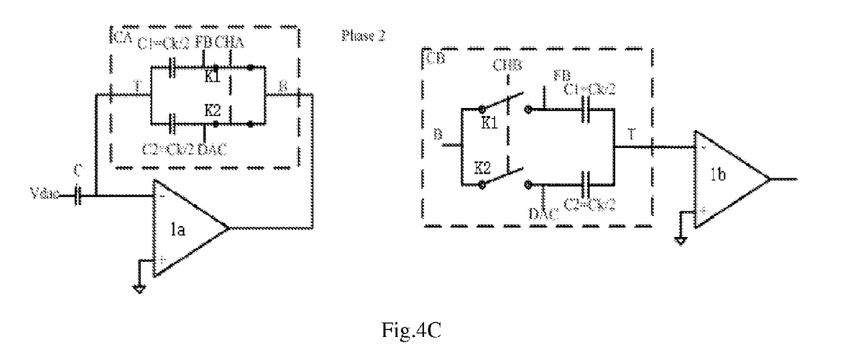
FIG. 4C is a schematic depicting a second connection configuration of the periodic unit of FIG. 4A.

FIG. 4C depicts a second connection configuration of the periodic unit corresponding to the Phase 2 region of the timing diagram of FIG. 4A, in which both the first and fourth clock signals $\Phi_1$, CHB is at a low potential level, while the second and third clock signals $\Phi_2$, CHA are at a high potential level, thereby allowing the upstream stage of the periodic unit to operate in its holding phase. Accompanying this, an output terminal $V_{dac}$ of the upstream sub-DAC is connected to the second terminal of the reference capacitor $C_k$; the T terminal of the first capacitor network $C_A$ and the second terminal of the reference capacitor $C_k$ are interconnected and are both further connected to the negative input terminal of the upstream op-amp 1a; the FB and DAC terminals of the first capacitor network $C_A$ are disconnected from any other terminal; the B terminal of the first capacitor network $C_A$ is connected to the output terminal of the upstream op-amp 1a; and the output analog signal of the upstream op-amp 1a is fed to the next pipeline ADC stage of the periodic unit as an input analog signal. As such, the first and second capacitors $C_1$, $C_2$ of the first capacitor network $C_A$ are in parallel and the sum of their capacitances equates to the capacitance of the reference capacitor $C_k$. At the same time, these two parallel capacitors are also in parallel to the reference capacitor $C_k$. Therefore, it can be similarly concluded that the upstream stage can produce correct voltage output according to formula (5).

Concurrently, the downstream stage of the periodic unit operates in the sampling phase in this connection configuration, wherein the T terminal of the second capacitor network $C_B$ is connected to the negative input terminal of the downstream op-amp 1b; the output terminal of the upstream op-amp 1a is connected to the B terminal of the second capacitor network $C_B$; both of the first and second switches $K_1$, $K_2$ of the second capacitor network $C_B$ are open to disconnect the output terminal of the upstream op-amp 1a from the first and second capacitors $C_1$, $C_2$ of the second capacitor network $C_B$; the DAC and FB terminals of the second capacitor network $C_B$ are in an idle state; the input analog signal of the downstream stage of the periodic unit is fed to the input terminal of the downstream sub-ADC; and the output terminal of the downstream sub-ADC is connected to the input terminal of the downstream sub-DAC. As such, the first capacitor network $C_A$ is shared between the upstream and downstream stages of the periodic unit. Specifically, the residue amplification is done in the upstream stage and the output analog signal from the amplification is directly fed to the downstream stage as an input analog signal thereof. At the same time, the voltage of the input analog signal of the downstream stage is sampled by the first and second capacitors $C_1$, $C_2$ of the first capacitor network $C_A$, without needing any other capacitor or process to accomplish this purpose.

Figure 4D:
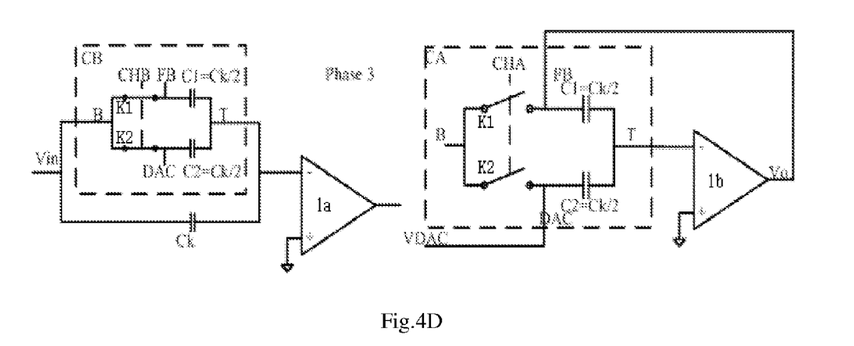
FIG. 4D is a schematic depicting a third connection configuration of the periodic unit of FIG. 4A.

FIG. 4D shows a third connection configuration of the periodic unit corresponding to the Phase 3 region of the timing diagram of FIG. 4A. In this configuration, the first and fourth clock signals $\Phi_1$, CHB is at a high potential level, while the second and third clock signals $\Phi_2$, CHA are at a low potential level. The third connection configuration can be simply obtained from the first connection configuration, through interchanging the first and second capacitor networks $C_A$, $C_B$ in the first connection configuration of the periodic unit as described above in conjunction with FIG. B.

Figure 4E:
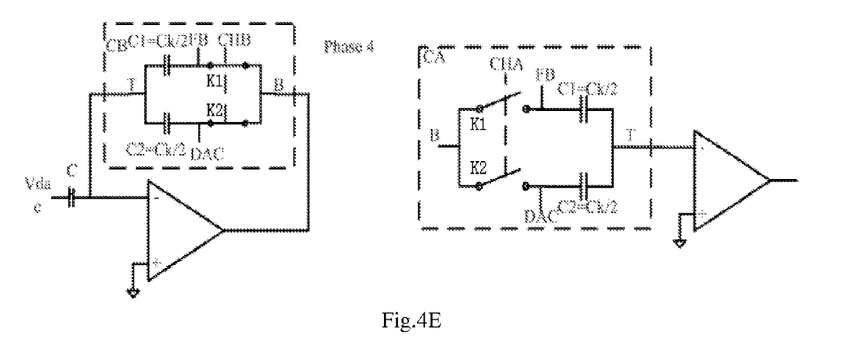
FIG. 4E is a schematic depicting a fourth connection configuration of the periodic unit of FIG. 4A.

FIG. 4E shows a fourth connection configuration of the periodic unit corresponding to the Phase 4 region of the timing diagram of FIG. 4A, in which the first and third clock signals $\Phi_1$, CHA is at a low potential level, while the second and fourth clock signals $\Phi_2$, CHB are at a high potential level. Similarly, the fourth connection configuration can be obtained from the second connection configuration, through interchanging the first and second capacitor networks $C_A$, $C_B$ in the second connection configuration of the periodic unit as described above in connection with FIG. C.

In these embodiments, the interchanging between the first and second capacitor networks $C_A$, $C_B$ that is accompanied by the switching between the first and third connection configurations of the periodic unit, or between the second and fourth connection configurations of the periodic unit, is accomplished by the aforementioned corresponding switches that are controlled by the third and fourth clock signals CHA, CHB.

Above described is only one periodic unit of the pipeline ADC of the invention. In fact, from the first stage down to the last stage of the pipeline ADC, each odd-number-th stage and the adjacent next even-number-th stage form one such periodic unit.

For example, in a preferred embodiment of the invention, the pipeline ADC includes nine stages, in which, the first to eighth stages, Stages 1 to 8, form fourth of such periodic units, a first periodic unit consisting of Stages 1 and 2, a second periodic unit of Stages 3 and 4, a third periodic unit of Stages 5 and 6 (both not shown), and a fourth periodic unit of Stages 7 and 8. Each of the first to eighth stages is a 1.5-bit stage that can produce four possible binary code outputs, including three effective codes, '00', '01' and '10', and a redundant code, '11'. Because the ninth stage, Stage 9, is the last stage that is not provided with any subsequent stage for the correction of its digital output, it is implemented as a 2-bit Flash ADC that compares an input analog signal $V_{in}$ to two different reference levels $V_{ref}$ and thereby outputs a corresponding effective code, '00', '01', '10' or '11'.

Figure 5A:
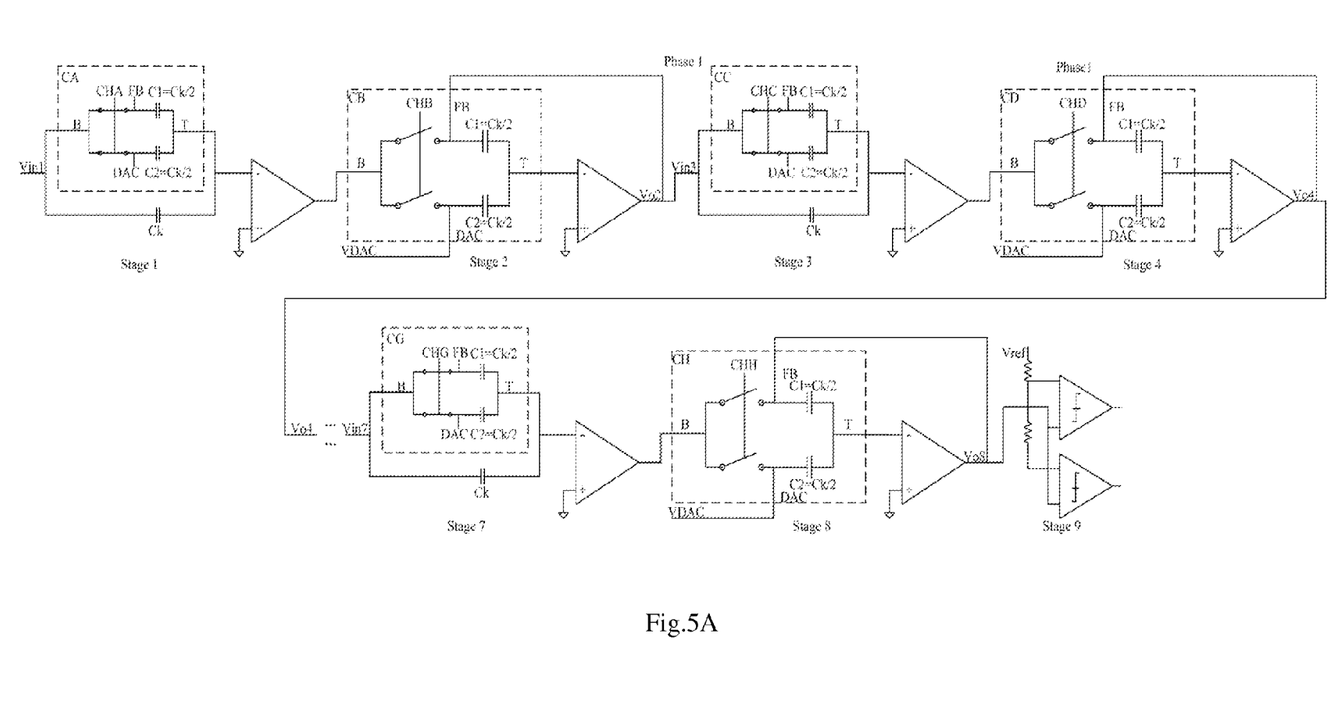
FIG. 5A is a schematic of a pipeline ADC in accordance with a preferred embodiment of the present invention, with each of its periodic units in the first connection configuration of FIG. 4B.

FIG. 5A is a schematic of the pipeline ADC of the preferred embodiment, with each of its four periodic units in the first connection configuration that corresponds to the Phase 1 region of the timing diagram of FIG. 4A, as described above in conjunction with FIG. 4B.

Figure 5B:
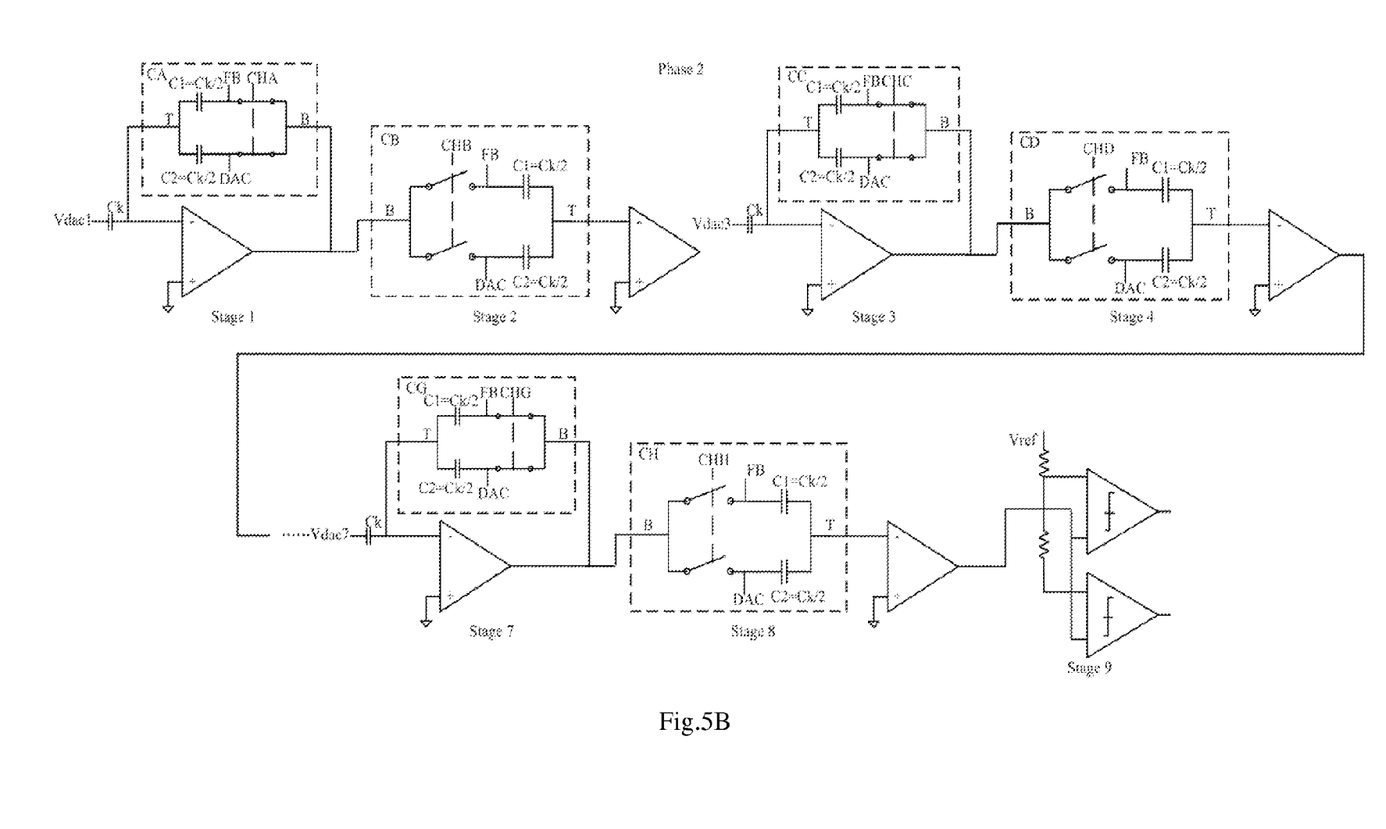
FIG. 5B is a schematic of the pipeline ADC of FIG. 5A, with each of the periodic units in the second connection configuration of FIG. 4C.

FIG. 5B is a schematic of the pipeline ADC of the preferred embodiment, with each of its four periodic units in the second connection configuration that corresponds to the Phase 2 region of the timing diagram of FIG. 4A, as described above in conjunction with FIG. 4C.

Figure 5C:
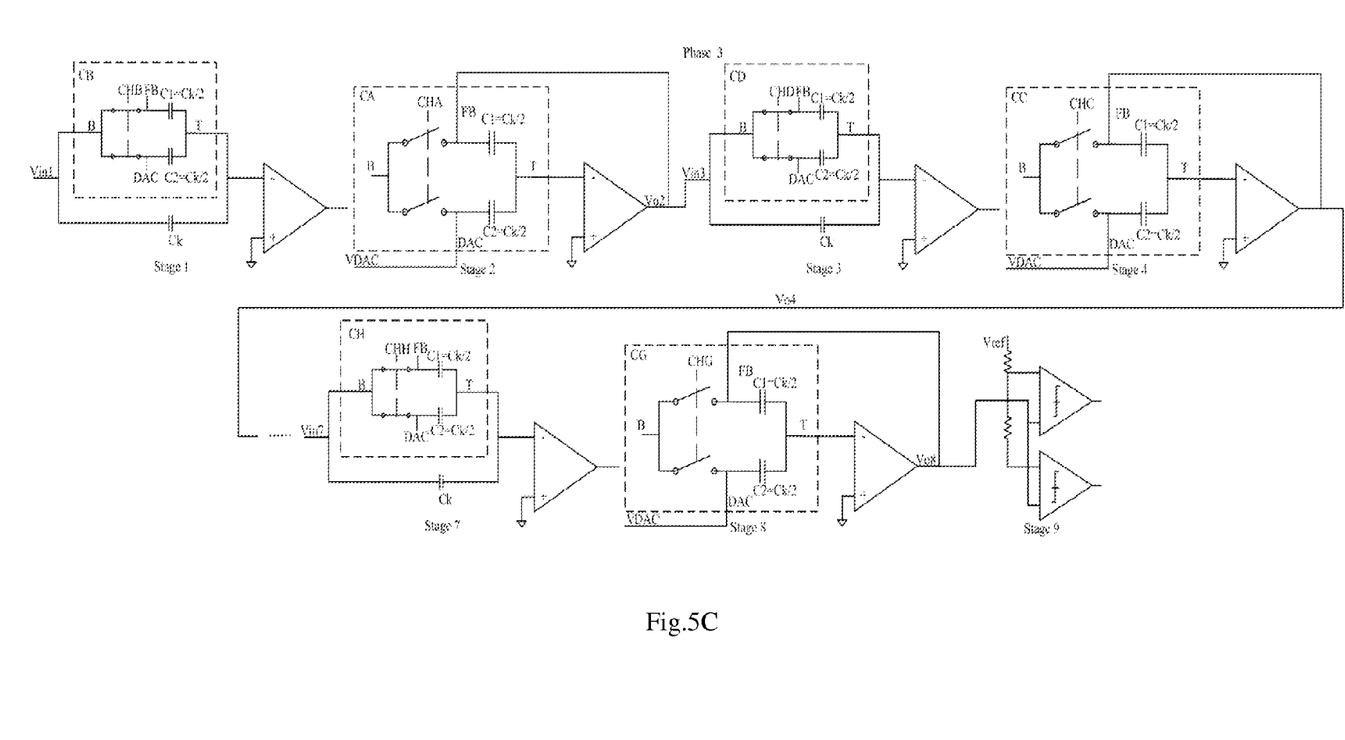
FIG. 5C is a schematic of the pipeline ADC of FIG. 5A, with each of the periodic units in the third connection configuration of FIG. 4D.

FIG. 5C is a schematic of the pipeline ADC of the preferred embodiment, with each of its four periodic units in the third connection configuration that corresponds to the Phase 3 region of the timing diagram of FIG. 4A, as described above in conjunction with FIG. 4D.

Figure 5D:
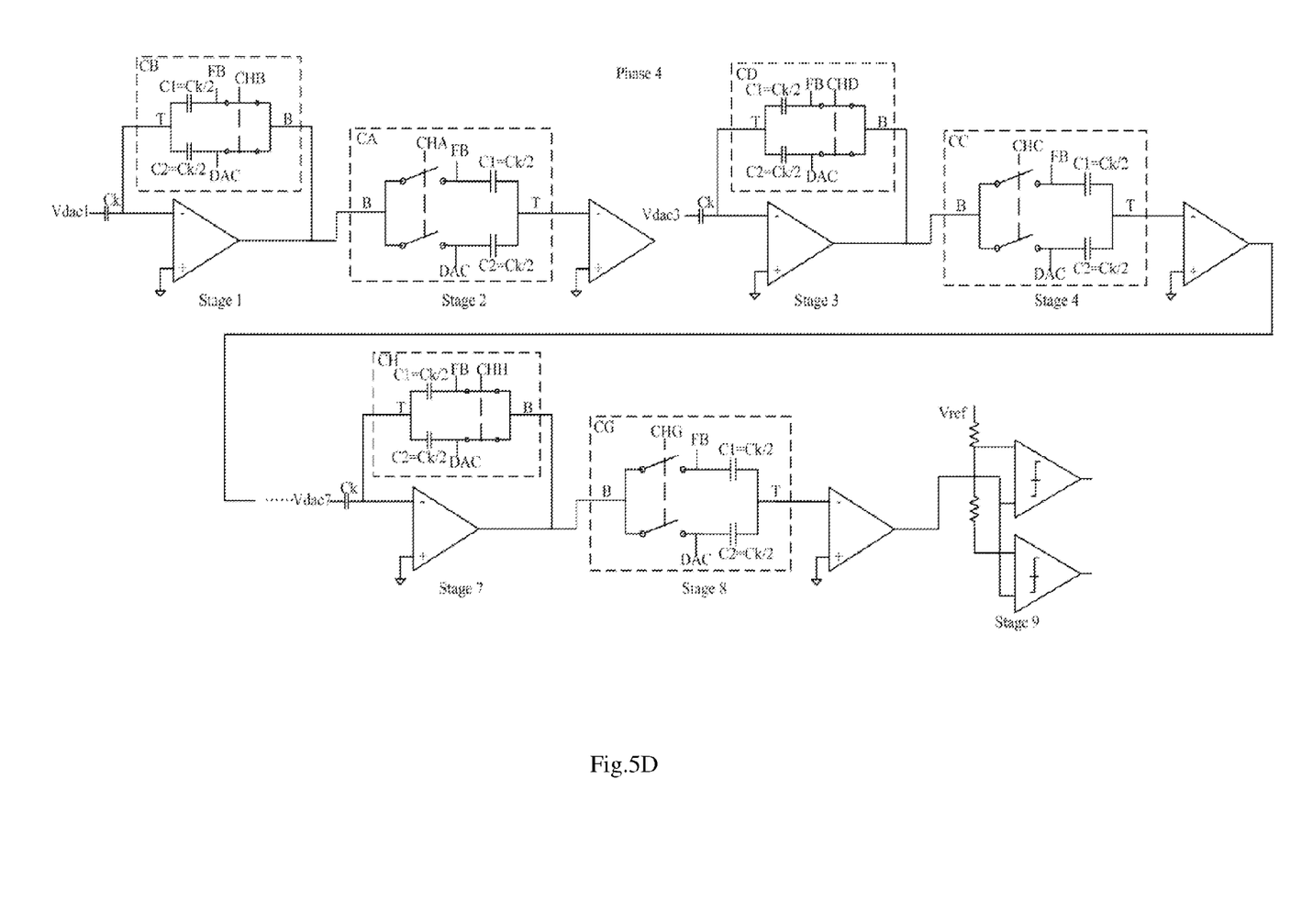
FIG. 5D is a schematic of the pipeline ADC of FIG. 5A, with each of the periodic units in the fourth connection configuration of FIG. 4E.

FIG. 5D is a schematic of the pipeline ADC of the preferred embodiment, with each of its four periodic units in the fourth connection configuration that corresponds to the Phase 4 region of the timing diagram of FIG. 4A. Similarly to the above description in conjunction with FIG. 4E, the fourth connection configuration of FIG. 5D can be obtained from the second connection configuration of FIG. 5B, by interchanging the first capacitor networks $C_A$, $C_C$, $C_G$ with the paired second capacitor networks $C_B$, $C_D$, $C_H$, respectively.

While specific embodiments have been presented in the foregoing description, they are not intended to limit the invention in any way. Those skilled in the art can make various modifications and variations without departing from the scope of the invention. Thus, it is intended that the present invention covers all such modifications and variations.

What is claimed is:

1. A pipeline analog-to-digital converter (ADC), comprising:
 a plurality of stages, wherein a first stage of the plurality of stages is adapted to receive an external analog signal and each of the plurality of stages is adapted to output an analog signal serving as an input analog signal for a next stage, wherein each odd-number-th stage and an adjacent next even-number-th stage thereof form a periodic unit;
 a first capacitor network and a second capacitor network for each periodic unit, the first and second capacitor networks both coupled to a corresponding periodic unit and having an identical structure;
 a first clock signal and a second clock signal inverted in phase and both coupled to each periodic unit, wherein the first and second clock signals are adapted to control one of the odd-number-th and even-number-th stages of each periodic unit to operate in a sampling phase, and to control the other of the odd-number-th and even-number-th stages of each periodic unit to operate in a holding phase; and
 a third clock signal and a fourth clock signal inverted in phase and both coupled to each periodic unit, wherein the third and fourth clock signals are adapted to couple each first capacitor network to one of the odd-number-th and even-number-th stages of a corresponding periodic unit, and to couple each second capacitor network to the other of the odd-number-th and even-number-th stages of the corresponding periodic unit.

2. The pipeline ADC of claim 1, wherein the odd-number-th stage of each periodic unit comprises a first ADC, a first digital-to-analog converter (DAC), a reference capacitor and a first operational amplifier (op-amp), and the even-number-th stage of each periodic unit comprises a second ADC, a second DAC and a second op-amp.

3. The pipeline ADC of claim 2, wherein the first capacitor network of each periodic unit comprises:
 a first capacitor, having a first terminal defined as a T1 terminal and a second terminal defined as a FB1 terminal;
 a first switch, having a first terminal coupled to the second terminal of the first capacitor and a second terminal defined as a B1 terminal;
 a second capacitor, having a first terminal coupled to the first terminal of the first capacitor and a second terminal defined as a DAC1 terminal; and
 a second switch, having a first terminal coupled to the second terminal of the second capacitor and a second terminal coupled to the second terminal of the first capacitor,
 wherein the second capacitor network of each periodic unit comprises:
 a third capacitor, having a first terminal defined as a T2 terminal and a second terminal defined as a FB2 terminal;
 a third switch, having a first terminal coupled to the second terminal of the third capacitor and a second terminal defined as a B2 terminal;
 a fourth capacitor, having a first terminal coupled to the first terminal of the third capacitor and a second terminal defined as a DAC2 terminal; and
 a fourth switch, having a first terminal coupled to the second terminal of the fourth capacitor and a second terminal coupled to the second terminal of the third capacitor, and
wherein one of the third and fourth clock signals is coupled to both of the first and second switches of the first capacitor network of each periodic unit, and the other of the third and fourth clock signals is coupled to both of the third and fourth switches of the second capacitor network of each periodic unit.

4. The pipeline ADC of claim 3, wherein the first, second, third and fourth capacitors of each periodic unit each have a capacitance half of a capacitance of the reference capacitor.

5. The pipeline ADC of claim 3, wherein each of the third and fourth clock signals has a cycle length that is twice a cycle length of each of the first and second clock signals.

6. The pipeline ADC of claim 3, wherein when both of the first and third clock signals are at a high potential level and both of the second and fourth clock signals are at a low potential level, the odd-number-th stage of each periodic unit operates in the sampling phase, while the even-number-th stage of each periodic unit is in the holding phase, concurrently with, in each periodic unit, an analog input of the odd-number-th stage being coupled to both of the B1 terminal of the corresponding first capacitor network and a first terminal of the reference capacitor, both of the first and second switches of the corresponding first capacitor network being closed, the T1 terminal of the corresponding first capacitor network and a second terminal of the reference capacitor being interconnected and both grounded, an input terminal of the first ADC being coupled to the analog input of the odd-number-th stage, an output terminal of the first ADC being coupled to an input terminal of the first DAC, an output terminal of the first DAC being disconnected from the second terminal of the reference capacitor, both of the FB1 and DAC1 terminals of the corresponding first capacitor network being kept idle, the T2 terminal of the corresponding second capacitor network being coupled to a negative input terminal of the second op-amp, an output terminal of the first op-amp being coupled to the B2 terminal of the corresponding second capacitor network, both of the third and fourth switches of the corresponding second capacitor network being open to disconnect the output terminal of the first op-amp from the third and fourth capacitors of the corresponding second capacitor network, the DAC2 terminal of the corresponding second capacitor network being coupled to an output terminal of the second DAC, and the FB2 terminal of the corresponding second capacitor network being coupled to the output terminal of the second op-amp.

7. The pipeline ADC of claim 3, wherein when both of the first and fourth clock signals are at a low potential level and both of the second and third clock signals are at a high potential level, the odd-number-th stage of each periodic unit operates in the holding phase, while the even-number-th stage of each periodic unit is in the sampling phase, concurrently with, in each periodic unit, the output terminal of the first DAC being coupled to the second terminal of the reference capacitor, the T1 terminal of the corresponding first capacitor network and the second terminal of the reference capacitor being interconnected and both coupled to a negative input terminal of the first op-amp, both of the FB1 and DAC1 terminals of the corresponding first capacitor network being kept idle, the B1 terminal of the corresponding first capacitor network being coupled to the output terminal of the first op-amp, the output terminal of the first op-amp being coupled to an input terminal of the second ADC, the T2 terminal of the corresponding second capacitor network being coupled to the negative input terminal of the second op-amp, the output terminal of the first op-amp being coupled to the B2 terminal of the corresponding second capacitor network, both of the third and fourth switches of the corresponding second capacitor network being open to disconnect the output terminal of the first op-amp from the third and fourth capacitors of the corresponding second capacitor network, both of the DAC2 and FB2 terminals of the corresponding second capacitor network being kept idle, and an output terminal of the second ADC being coupled to an input terminal of the second DAC.

8. The pipeline ADC of claim 3, wherein when both of the first and fourth clock signals are at a high potential level and both of the second and third clock signals are at a low potential level, the odd-number-th stage of each periodic unit operates in the sampling phase, while the even-number-th stage of each periodic unit is in the holding phase, concurrently with, in each periodic unit, the analog input of the odd-number-th stage being coupled to both of the B2 terminal of the corresponding second capacitor network and the first terminal of the reference capacitor, both of the third and fourth switches of the corresponding second capacitor network being closed, the T2 terminal of the corresponding second capacitor network and the second terminal of the reference capacitor being interconnected and both grounded, the input terminal of the first ADC being coupled to the analog input of the odd-number-th stage, the output terminal of the first ADC being coupled to the input terminal of the first DAC, the output terminal of the first DAC being disconnected from the second terminal of the reference capacitor, both of the FB2 and DAC2 terminals of the corresponding second capacitor network being kept idle, the T1 terminal of the corresponding first capacitor network being coupled to the negative input terminal of the second op-amp, the output terminal of the first op-amp being coupled to the B1 terminal of the corresponding first capacitor network, both of the first and second switches of the corresponding first capacitor network being open to disconnect the output terminal of the first op-amp from the first and second capacitors of the corresponding first capacitor network, the DAC1 terminal of the corresponding first capacitor network being coupled to the output terminal of the second DAC, and the FB1 terminal of the corresponding first capacitor network being coupled to the output terminal of the second op-amp.

9. The pipeline ADC of claim 3, wherein when both of the first and third clock signals are at a low potential level and both of the second and fourth clock signals are at a high potential level, the odd-number-th stage of each periodic unit operates in the holding phase, while the even-number-th stage of each periodic unit is in the sampling phase, concurrently with, in each periodic unit, the output terminal of the first DAC being coupled to the second terminal of the reference capacitor, the T2 terminal of the corresponding second capacitor network and the second terminal of the reference capacitor being interconnected and both coupled to the negative input terminal of the first op-amp, both of the FB2 and DAC2 terminals of the corresponding second capacitor network being kept idle, the B2 terminal of the corresponding second capacitor network being coupled to the output terminal of the first op-amp, the output terminal of the first op-amp being coupled to the input terminal of the second ADC, the T1 terminal of the corresponding first capacitor network being coupled to the negative input terminal of the second op-amp, the output terminal of the first op-amp being coupled to the B1 terminal of the corresponding first capacitor network, both of the first and second switches of the corresponding first capacitor network being open to disconnect the output terminal of the first op-amp from the first and second capacitors of the corresponding first capacitor network, both of the DAC1 and FB1 terminals of the corresponding first capacitor network being kept idle, and the output terminal of the second ADC being coupled to the input terminal of the second DAC.

10. The pipeline ADC of claim 1, wherein the pipeline ADC includes eight stages that form four periodic units.

* * * * *